United States Patent [19]

Tateishi

[11] Patent Number: 4,982,119
[45] Date of Patent: Jan. 1, 1991

[54] COMPARATOR WITH LATCH CIRCUIT

[75] Inventor: Michiko Tateishi, Tokyo, Japan
[73] Assignee: NEC Corporation, Japan
[21] Appl. No.: 320,102
[22] Filed: Mar. 6, 1989
[30] Foreign Application Priority Data

Mar. 10, 1988 [JP] Japan .................. 63-57488

[51] Int. Cl.⁵ .................. H03K 3/287; H03K 5/24
[52] U.S. Cl. .................. 307/530; 307/291; 307/362
[58] Field of Search .................. 307/350, 530, 279, 289, 307/291, 362

[56] References Cited
U.S. PATENT DOCUMENTS

| | | | |
|---|---|---|---|
| 3,953,746 | 4/1976 | Fett | 307/291 |
| 4,147,943 | 4/1979 | Peterson | 307/530 |
| 4,560,888 | 12/1985 | Oida | 307/291 |
| 4,628,216 | 12/1986 | Mazumder | 307/291 |

*Primary Examiner*—John Zazworsky
*Attorney, Agent, or Firm*—Laff, Whitesel, Conte & Saret

[57] ABSTRACT

A comparator with a latch circuit includes a comparator circuit and a latch circuit. The comparator circuit includes first to third transistor pairs constituting differential pairs. The first transistor pair, which receives a clock in a conventional circuit, receives input data. The bases of the second and third transistor pairs receive a clock. The collector of one transistor of each of the second and third transistor pairs is connected to a power source through a load resistor. The latch circuit includes fourth to sixth transistor pairs constituting differential pairs. The fourth transistor pair receives at their bases the collector potentials, having the load resistances, of the second and third transistor pairs through emitter-follower circuits. The fifth and sixth transistor pairs receive clocks having opposite polarities at their bases. The collector of one transistor of each of the fifth and sixth transistor pairs is connected to the corresponding load resistor.

3 Claims, 3 Drawing Sheets

COMPARATOR WITH LATCH CIRCUIT

BACKGROUND OF THE INVENTION

The present invention relates to a comparator with a latch circuit and, more particularly, to a clock signal and an input data range of such a comparator.

A conventional comparator with a latch circuit has an arrangement as shown in FIG. 3. More specifically, in order to fetch data, a true clock signal $\phi$ is input to the base of a transistor 34 and a complementary clock signal $\bar{\phi}$ is input to the base of a transistor 35. Since the transistors 34 and 35 constitute a differential pair, a current flowed through a transistor 36 constituting a constant current source is flowed through the transistor 34, and the transistor 35 is disabled. In this case, when input data IN input to the base of a transistor 30 constituting a differential pair with a transistor 31, which receives a reference voltage at the base, is higher than the reference voltage, the transistor 31 is disabled, and a current flowed through the transistor 34 is flowed through the transistor 30. A potential lowered by the current flowed through a resistor 28 from a potential Vcc appears at the collector of the transistor 30. More specifically, if a current flowed as a constant current is represented by I, the collector potential of the transistor 30 is given by $Vcc - I \times R_{28}$. On the other hand, the potential Vcc is applied to the collector of the transistor 31. When the input data is to be latched next, the complementary clock signal $\bar{\phi}$ is input to the base of the transistor 34, and the true clock signal $\phi$ is input to the base of the transistor 35. The transistor 34 is disabled, and a current is flowed through the transistor 35. In this case, according to the previous state, a potential defined by $Vcc - I \times R_{28}$ as the collector potential of the transistor 30 is applied to the base of the transistor 32, and the potential Vcc as the collector potential of the transistor 31 is applied to the collector of the transistor 32. The potential Vcc as the collector potential of the transistor 31 is applied to the base of the transistor 33, and the potential $Vcc - I \times R_{28}$ as the collector potential of the transistor 30 is applied to the collector of the transistor 33. Therefore, since the transistors 30 and 31 constitute the differential pair, the transistor 32 is disabled, and a current is flowed through the transistor 33. Thus, the potential $Vcc - I \times R_{28}$ is applied to the collector of the transistor 30 common to that of the transistor 33, and the potential Vcc is applied to the collector of the transistor 31 common to that of the transistor 32. In other words, the previous state is latched.

In FIG. 3, reference numerals 30 to 36 denote NPN transistors; 28, 29, and 37, resistors; and 38, a power source.

In the conventional comparator with the latch circuit described above, since the transistor receiving the clock $\phi$ is located at the lowermost stage of a vertical structure, an input data range corresponds to a range of the power source Vcc to the clock input signal. For this reason, assume that an input data signal is driven by an amplifier and is input to the comparator with the latch circuit, and the amplifier and the latch circuit use a common power source. In this case, an output voltage of the amplifier is lower than the power source voltage. Therefore, the amplifier for driving the input data must have a power source of a higher potential than the power source voltage of the comparator with the latch circuit when the data signal input to the latch circuit has an amplitude up to the power source voltage. More specifically, the comparator with the latch circuit and the amplifier must have independent power sources.

SUMMARY OF THE INVENTION

It is therefore an object of the present invention to provide a comparator with a latch circuit which can use a power source common to an amplifier for driving an input data signal.

In order to achieve the above object, according to an aspect of the present invention, there is provided a comparator with a latch circuit, comprising: a comparator circuit including three transistor pairs, which include a first transistor, the base of which receives an input data signal, a second transistor, the base of which is applied with a voltage source, the first and second transistors constituting a first transistor pair, the common emitter of which is connected to a constant current source, third and sixth transistors, the emitters of which are connected to the collectors of the first and second transistors, the commonly connected bases of which receive a clock signal, and the collectors of which are connected to a power source through load resistors, a fourth transistor which constitutes a second transistor pair with the third transistor, and a fifth transistor which constitutes a third transistor pair with the sixth transistor, the fourth and fifth transistors being respectively connected to the collectors of the first and second transistors and differentially arranged with the third and sixth transistors, an inverted clock signal being input to the commonly connected bases of the fourth and fifth transistors, and the collectors of the fourth and fifth transistors being connected to the power source; and a latch circuit including three transistor pairs, which include seventh and eighth transistors, the common emitter of which is connected to a constant current source and which constitute a fourth transistor pair, ninth and twelfth transistors, the emitters of which are connected to the collectors of the seventh and eighth transistors, the bases of which are connected to the bases of the third and sixth transistors, and the collectors of which are connected to the power source, a tenth transistor which constitutes a fifth transistor pair with the ninth transistor, and an eleventh transistor which constitutes a sixth transistor pair with the twelfth transistor, the tenth and eleventh transistors being respectively connected to the collectors of the seventh and eighth transistors and differentially arranged with the ninth and twelfth transistors, the bases of the tenth and eleventh transistors being commonly connected to the bases of the fourth and fifth transistors, and the collectors of the tenth and eleventh transistors being respectively connected to the collectors of the third and sixth transistors, so that a signal is fed back to the bases of the seventh and eighth transistors through emitter-follower circuits, respectively.

DESCRIPTION OF THE PREFERRED EMBODIMENTS

An embodiment of the present invention will now be described with reference to the accompanying drawings.

Figure 1:
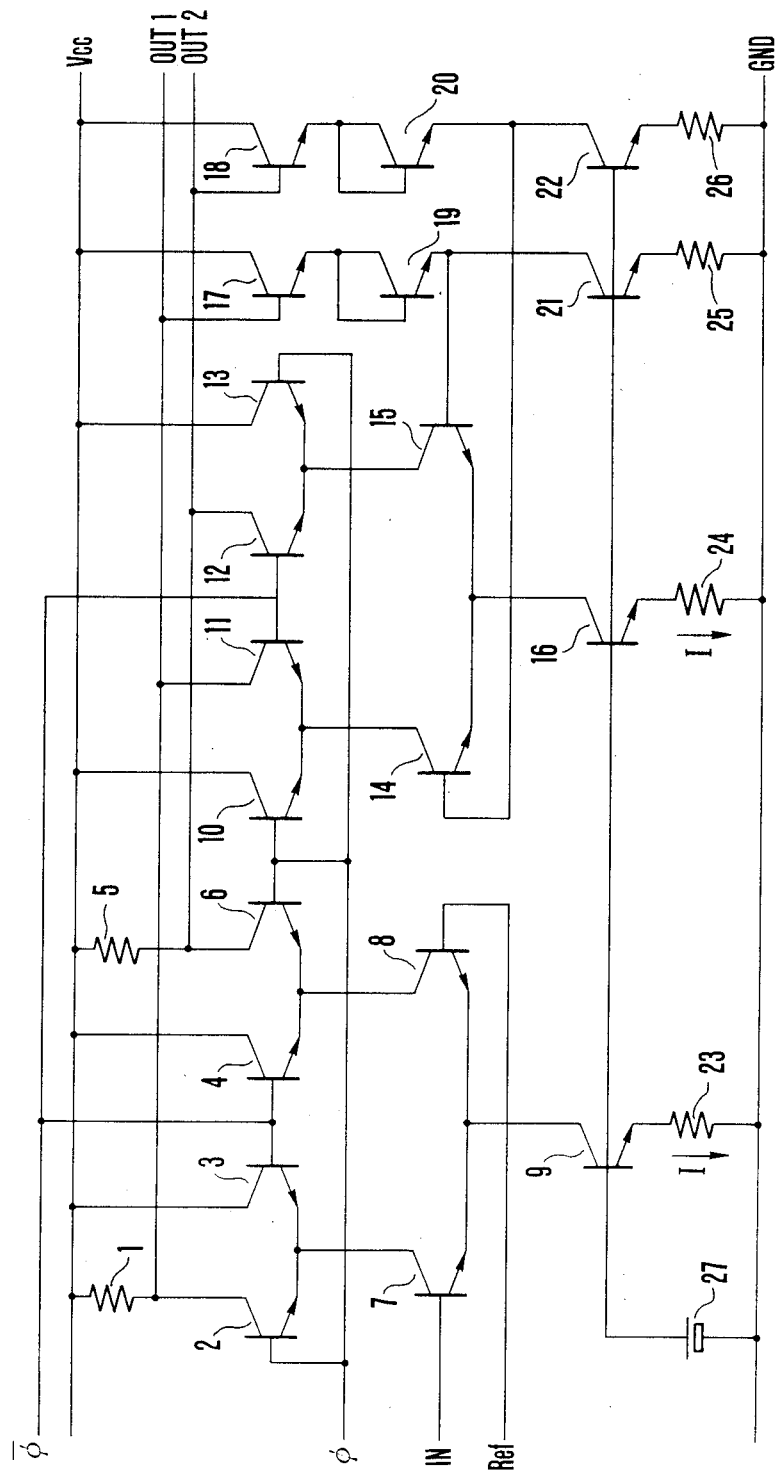
FIG. 1 is a circuit diagram showing an embodiment of the present invention.

FIG. 1 shows an embodiment of the present invention. In FIG. 1, reference numerals 1, 5, and 23 to 26 denote resistors; 2 to 4 and 6 to 22, transistors; and 27, a power source.

A comparator with a latch circuit according to the present invention comprises: a comparator circuit including first to third transistor pairs constituting differential pairs, in which the first transistor pair, which receives a clock in a conventional circuit, receives input data, the second and third transistor pairs receive a clock at the bases thereof, and the collector of one transistor of each of the second and third transistor pairs is connected to a power source through a load resistor; and a latch circuit including fourth to sixth transistor pairs constituting differential pairs, in which the fourth transistor pair receives at their bases the collector potentials, having the load resistances, of the second and third transistor pairs through emitter-follower circuits, respectively, the fifth and sixth transistor pairs receive clocks having opposite polarities at their bases, and the collector of one transistor of each of the fifth and sixth transistor pairs is connected to the corresponding load resistor.

An operation according to the embodiment of the present invention will now be described. True and complementary clock signals $\phi$ and $\bar{\phi}$ have an opposite phase relationship. A high-level period of the clock $\phi$ (i.e., a low-level period of the clock $\bar{\phi}$) is assigned to a comparison operation period of the input signal IN, and a low-level period of the clock $\phi$ (i.e., a high-level period of the clock $\bar{\phi}$) is assigned to a latch period of the comparison result. In the comparison operation period, the high-level clock $\phi$ is supplied to the bases of the transistors 2, 6, 10, and 13, and the low-level clock $\bar{\phi}$ is supplied to the transistors 3, 4, 11, and 12. When data input IN to the base of the transistor 7 is higher than the reference voltage Ref as the base potential of the transistor 8 constituting a differential pair with the transistor 7, a current I flowed through the transistor 9 as a constant current source is flowed through the transistors 2 and 7. The collector potential of the transistor 2, i.e., a potential at a terminal OUT1 is made lower to become equal to $Vcc - I \times R_1$, while a potential at a terminal OUT2 as the collector potential of the transistor 6 becomes equal to Vcc.

These comparison results are latched when the clocks $\phi$ and $\bar{\phi}$ are respectively at low and high levels. In this case, the transistors 2, 6, 10, and 13 are turned off, and the transistors 3, 4, 11, and 12 are turned on. On the other hand, a potential lower by $2V_{BE}$ than the potential at the terminal OUT1 is applied to the base of the transistor 15 through the transistors 17 and 19 constituting an emitter-follower circuit. That is, according to the previous state, since the terminal OUT1 has a lower potential equal to $Vcc - I \times R_1$ according to the previous state, a voltage defined by $Vcc - I \times R_1 - 2V_{BE}$ is applied to the base of the transistor 15. Similarly, a higher voltage defined by $Vcc - 2V_{BE}$ is applied to the base of the transistor 14. Therefore, a current flowed through the transistor 16 as the constant current source is flowed through the transistors 14 and 11. The potential at the terminal OUT1 becomes equal to $Vcc - I \times R_1$, and the potential at the terminal OUT2 becomes equal to Vcc. In this manner, the comparison results are latched, and this state is held until the clocks $\phi$ and $\bar{\phi}$ again go to high and low levels, respectively.

Figure 2:
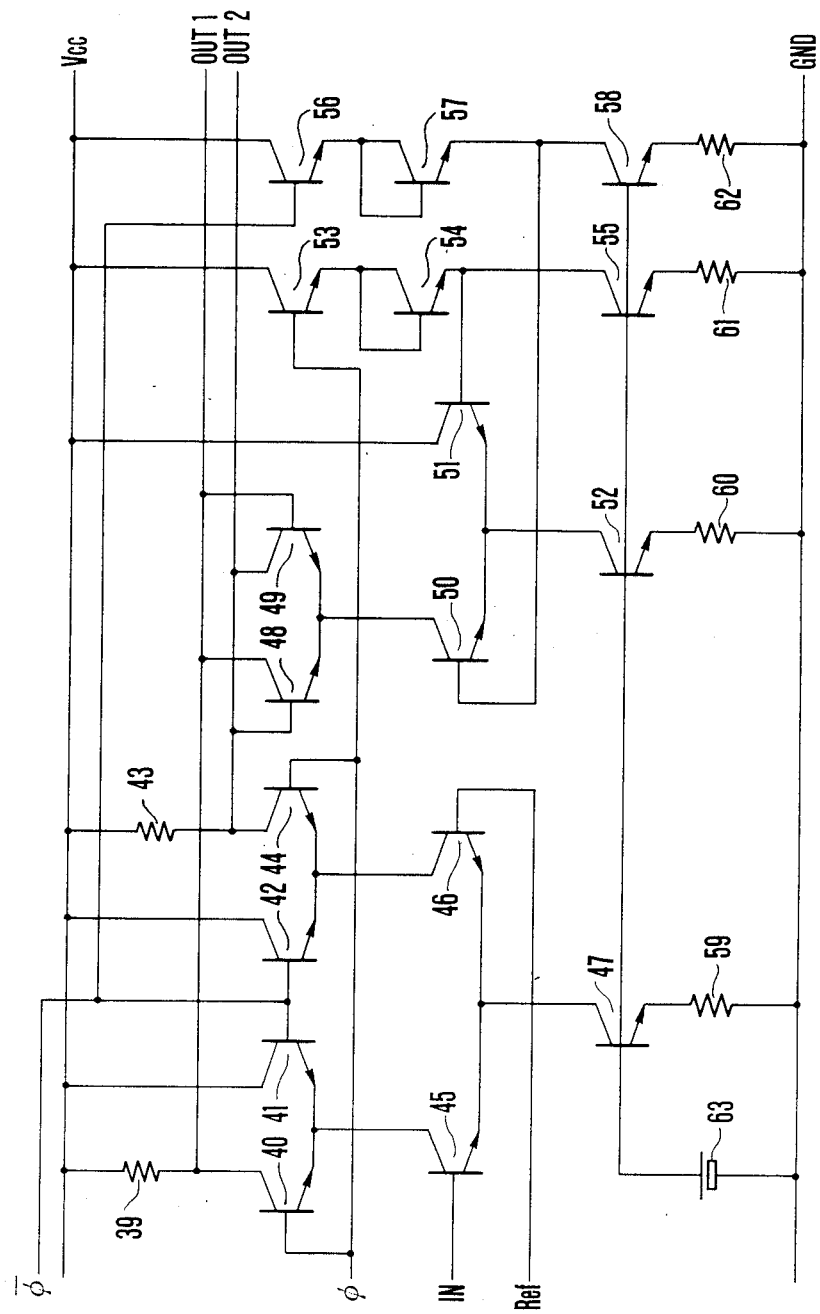
FIG. 2 is a circuit diagram showing another embodiment of the present invention.
Figure 3:
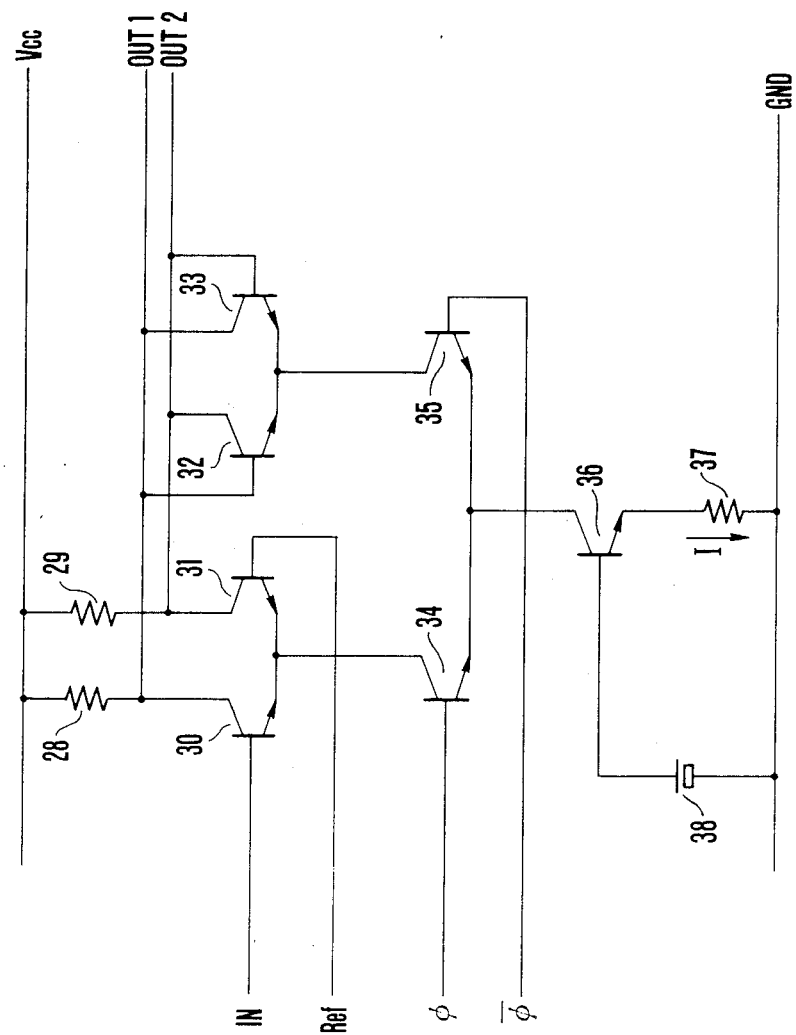
FIG. 3 is a circuit diagram showing a prior art.

FIG. 2 shows another embodiment of the present invention. In FIG. 3, reference numerals 39, 43, 59 to 62 denote resistors; 40 to 42 and 44 to 58, NPN transistors; and 63, a power source. In this embodiment, since a clock signal $\phi$ and a complementary clock signal $\bar{\phi}$ are input to the bases of a differential transistor pair at the lower stage of a latch circuit through emitter-follower circuits, the same operation as in FIG. 1 is performed when data is fetched. A comparator circuit constituted by the transistors 45 to 47, 40 to 42, and 44 has the same arrangement as the comparator circuit constituted by the transistors 7 to 9, 2 to 4, and 6 in the embodiment shown in FIG. 1. The clocks $\phi$ and $\bar{\phi}$ used in this comparator circuit are used in the same manner as those in FIG. 1. More specifically, the true and complementary clock signals $\phi$ and $\bar{\phi}$ have an opposite phase relationship. A high-level period of the clock $\phi$ (i.e., a low-level period of the clock $\bar{\phi}$) is assigned to a comparison operation period of the input signal IN, and a low-level period of the clock $\phi$ (i.e., a high-level period of the clock $\bar{\phi}$) is assigned to a latch period of the comparison result. In a comparison operation, the true clock signal $\phi$ goes high, and the complementary clock signal $\bar{\phi}$ goes low. Therefore, in this case, the high-potential clock signal $\phi$ is input to the bases of the transistors 40, 44, and 53, and the low-potential complementary clock signal $\bar{\phi}$ is input to the transistors 41, 42, and 56. In this case, input data IN is compared with a reference value Ref. The comparison result is represented by changes in collector potential of the transistors 40 and 44, and is output to output terminals OUT1 and OUT2. The clock signals $\phi$ and $\bar{\phi}$ are also input to the bases of the transistors 53 and 56, respectively. Therefore, when the above-mentioned clock $\phi$ is at high potential, the base potential of the transistor 51 is higher than that of the transistor 50. Therefore, the following latch circuit does not operate. However, when the clock $\phi$ goes low and the clock $\bar{\phi}$ goes high, the base of the transistor 50 has a higher potential than that of the transistor 51, and a current flowed through a transistor as the constant current source is flowed through the transistor 50 constituting a differential pair together with the transistor 51 through the emitter-follower circuits. In this case, a current is flowed through one of the transistors 48 and 49 depending on the collector potentials of the transistors 44 and 40, which are connected to the bases of the transistors 48 and 49 constituting a differential pair connected to the collector of the transistor 50. Therefore, when the potential at the output terminal OUT1 is low and that at the output terminal OUT2 is high, the transistor 48 is turned on, thereby latching data. In this embodiment, since a clock is input to the lower stage of the two-stage vertical structure, the same operation circuit can be realized by fewer circuit elements by two elements than the embodiment shown in FIG. 1.

As described above, a comparator with a latch circuit according to the present invention comprises: a comparator circuit including first to third transistor pairs constituting differential pairs, in which the first transistor pair, which receives a clock in a conventional circuit, receives input data, the second and third transistor pairs receive a clock at the bases thereof, and the collector of one transistor of each of the second and third transistor pairs is connected to a power source through a load resistor; and a latch circuit including fourth to sixth transistor pairs constituting differential pairs, in which the fourth transistor pair receives at their bases the collector potentials, having the load resistances, of the second and third transistor pairs through emitter-follower circuits, respectively, the fifth and sixth transistor pairs receive clocks having opposite polarities at their bases, and the collector of one transistor of each of the fifth and sixth transistor pairs is connected to the corresponding load resistor. Therefore, a power source for an amplifier for driving input data can be used common to that of the comparator with the latch circuit.

The latch circuit may include two transistor pairs, i.e., a seventh transistor pair constituting a differential pair, in which a clock is fed back to the bases through emitter-follower circuits, and an eighth transistor pair which is connected to the collectors of the seventh transistor pair and is differentially arranged, and in which the collector of one transistor is connected to the base of the other transistor. Thus, an effect equivalent to the above-mentioned comparator with the latch circuit can be realized by fewer circuit elements by two elements than the above-mentioned comparator.

Note that the present invention is not limited to the bipolar transistors but can be applied to MOS transistors.

What is claimed is:

1. A comparator with a latch circuit comprising:
    a comparator circuit including three transistor pairs, which include a first transistor having a base which is coupled to receive an input data signal, a second transistor having a base which is coupled to a voltage source, said first and second transistors constituting a first of said transistor pairs, said first and second transistors having emitters which are coupled in common to a constant current source, third and fourth transistors having emitters which are respectively coupled to collectors of said first and second transistors, said third and fourth transistors having bases which are commonly coupled to receive a clock signal, and having collectors coupled to a power source via load resistors, a fifth transistor which together with said third transistor constitutes a second of said transistor pairs, and a sixth transistor which together with said fourth transistor constitutes a third transistor pair, said fifth and sixth transistors having emitters respectively connected to the collectors of said first and second transistors and differentially arranged with respect to said third and fourth transistors respectively, an inverted clock signal being input to the commonly coupled bases of said fifth and sixth transistors, and said fifth and sixth transistors having collectors coupled to said power source; and
    a latch circuit including three transistor pairs, which include seventh and eighth transistors having emitters which are coupled in common with a constant current source, said seventh and eighth transistors constituting a fourth transistor pair, ninth and tenth transistors having emitters which are respectively coupled to collectors of said seventh and eighth transistors, the ninth and tenth transistors having bases which are commonly coupled to the bases of said third and fourth transistors and having collectors which are coupled to said power source, an eleventh transistor which together with said ninth transistor constitutes a fifth transistor pair, and a twelfth transistor which together with said tenth transistor constitutes a sixth transistor pair, said eleventh and twelfth transistors having emitters respectively coupled to the collectors of said seventh and eighth transistors and differentially arranged with said ninth and tenth transistors respectively, said eleventh and twelfth transistors having bases which are commonly coupled to the bases of said fifth and sixth transistors, and having collectors which are respectively coupled to the collectors of said third and fourth transistors, and first and second emitter-follower circuits for coupling the collectors of said third and fourth transistors respectively to the bases of said eighth and seventh transistors.

2. A comparator with a latch circuit, comprising:
    a comparator circuit including three transistor pairs, which include a first transistor having a base which receives an input data signal, a second transistor having a base which is coupled to a voltage source, said first and second transistors constituting a first transistor pair, said first and second transistors having emitters which are coupled to a constant current source, third and fourth transistors having emitters which are coupled to collectors of said first and second transistors respectively, and having bases which are coupled in common to receive a clock signal, said third and fourth transistors having collectors which are connected through load resistors to a power source, a fifth transistor which together with said third transistor constitutes a second transistor pair, and a sixth transistor which together with said fourth transistor constitutes a third transistor pair, said fifth and sixth transistors having emitters which are respectively connected to the collectors of said first and second transistors and being differentially arranged with said third and fourth transistors respectively, an inverted clock signal being applied in common to bases of said fifth and sixth transistors, said bases of said fifth and sixth transistors being connected in common, and collectors of said fifth and sixth transistors being connected to said power source; and
    a latch circuit including two transistor pairs, which include seventh and eighth transistors which together constitute a fourth transistor pair, said seventh and eighth transistors having emitters which are coupled in common to a constant current source, a first emitter-follower circuit for applying said clock signal to a base of said eighth transistor, a second emitter-follower circuit for applying said inverted clock signal to a base of said seventh transistor, and ninth and tenth transistors which are coupled in common to a collector of said seventh transistor and which are differentially arranged, said ninth transistor having a collector coupled to a base of said tenth transistor, said ninth transistor having a collector coupled to the collector of said third transistor and a base coupled to the collector of said fourth transistor, and said tenth transistor having a collector coupled to the collector of said fourth transistor and a base coupled to the collector of said third transistor.

3. A transistor circuit comprising:
    first and second transistors, one of which receives an input signal voltage, the other of which receives a reference voltage, and which are connected together to constitute a first differential pair;

third and fourth transistors which are operated by using said first transistor as a current source and which are connected together to constitute a second differential pair;

fifth and sixth transistors which are operated by using said second transistor as a current source and which are connected together to constitute a third differential pair;

means for commonly supplying a first clock signal to said third and sixth transistors, said clock signal taking a first level to indicate a comparison operation period and taking a second level to indicate a latch operation period;

means for commonly supplying a second clock signal to said fourth and fifth transistors, said second clock signal having a phase which is opposite to the phase of the first clock signal;

first and second output terminals coupled to said third and sixth transistors, respectively; and a latch circuit which is connected to said first and second output terminals, said first and second clock signals being applied to disable said latch circuit when said first clock signal takes said first level to indicate the comparison operation period, and said latch circuit be enabled to latch voltage levels at said first and second output terminals when said first clock signal takes said second level to indicate the latch operation period.

* * * * *